United States Patent [19]

DuBois

[11] 4,259,613
[45] Mar. 31, 1981

[54] FLUORESCENT INDICATOR AND METHOD OF MAKING SAME

[75] Inventor: Richard DuBois, North Caldwell, N.J.

[73] Assignee: Wagner Electric Corporation, Parsippany, N.J.

[21] Appl. No.: 1,302

[22] Filed: Jan. 5, 1979

Related U.S. Application Data

[60] Continuation-in-part of Ser. No. 868,678, Jan. 11, 1978, Pat. No. 4,206,404, which is a division of Ser. No. 732,330, Oct. 14, 1976, Pat. No. 4,100,455.

[51] Int. Cl.³ .................. H01J 63/02; H01J 63/06; H01J 9/32
[52] U.S. Cl. .................. 313/497; 29/25.16; 316/18
[58] Field of Search .............. 313/496, 497, 519, 517; 29/25.16; 316/18

[56] References Cited

U.S. PATENT DOCUMENTS

| | | | |
|---|---|---|---|
| 3,321,657 | 5/1967 | Granitsas et al. | 313/519 |
| 3,327,154 | 6/1967 | Bowerman | 313/519 |
| 3,418,509 | 12/1968 | Frouws et al. | 313/519 |
| 3,465,194 | 9/1969 | Hall | 313/217 X |
| 3,604,971 | 9/1971 | Tracy | 313/522 |
| 3,701,918 | 10/1972 | Allen et al. | 313/220 X |
| 3,735,180 | 5/1973 | Coulon | 313/519 |
| 3,897,614 | 8/1975 | Armstrong | 313/496 X |
| 4,048,538 | 9/1977 | Hendriks et al. | 313/519 |

FOREIGN PATENT DOCUMENTS 2040038 2/1972 Fed. Rep. of Germany .......... 313/496

Primary Examiner—Palmer C. Demeo
Attorney, Agent, or Firm—Eyre, Mann, Lucas & Just

[57] ABSTRACT

A fluorescent display has phosphor coated electrodes selectably electronically excited into an illuminated condition. A foraminous screen controls illumination of the electrodes. An embodiment of the invention with a linear array of anodes and an analog-to-digital power supply forms a linear scale indicator. A method of assembly is also disclosed.

23 Claims, 20 Drawing Figures

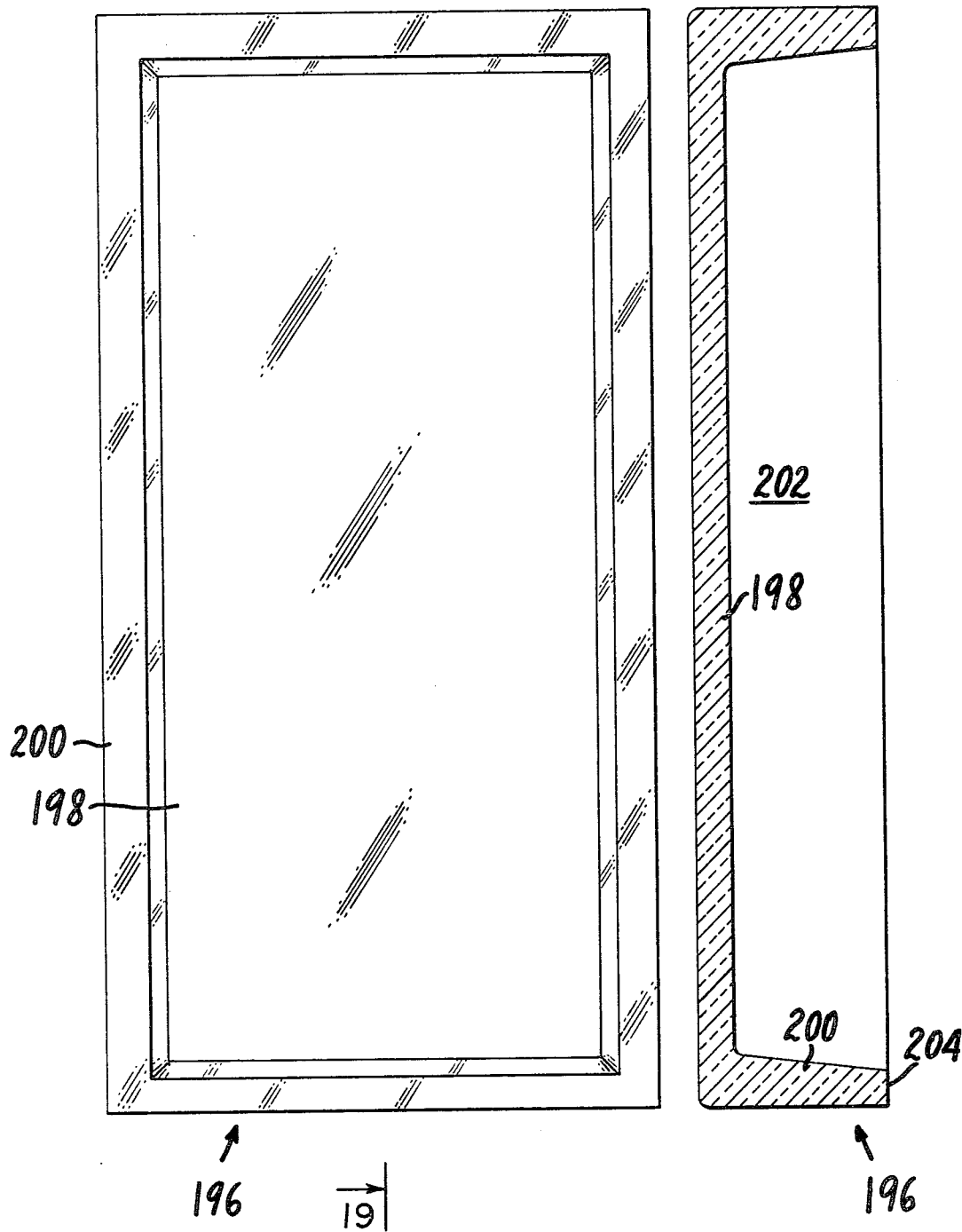

FLUORESCENT INDICATOR AND METHOD OF MAKING SAME

BACKGROUND OF THE INVENTION

This is a continuation-in-part of application Ser. No. 868,678 filed Jan. 11, 1978, now U.S. Pat. No. 4,206,404, which was a division of application Ser. No. 732,330 filed Oct. 14, 1976, which matured into U.S. Pat. No. 4,100,455.

Display devices which can be selectably illuminated to convey changing information have become increasingly important. The earliest illuminated display devices were fixed-message signs, such as "exit" or "no smoking" signs which contained a source of light capable of being turned on and off, and a partially translucent face plate containing the message. This type of display suffered washout by strong front illumination. U.S. Pat. No. 3,682,531, issued to A. R. Jeffers teaches a light trap consisting of a circular polarizer and optionally also of a specular foraminous screen to trap ambient light entering the face of the sign.

Electronically controllable display devices have grown particularly with the growth of computers. For example, a gas-discharge device containing a stacked set of transparent plates having shaped discharge regions therein has been in use for many years. The shaped discharge regions may for example form the numerals 0 through 9, one to a transparent plate. When the discharge regions in one plate are electrically energized, the characteristic glow of the gas discharge regions forms one of the numerals. Except when the particular plate illuminated is nearest the viewer, the illuminated numeral is viewed through one or more transparent deenergized plates. When an array of these gas-discharge devices are used to display multiple numerals, the varying distance of the illuminated plates from the viewer gives rise to annoying parallax.

In an attempt to eliminate parallax in a gas-discharge display device, S. M. Frouws, in U.S. Pat. No. 3,418,509, disclosed a planar gas discharge tube containing individually energizable segments spaced away from a counter electrode of transparent conductive material or a fine gauge wire screen through which the viewer observed the segments. The gas discharge was set up between the counter electrode and the energized segments. Early gas discharge devices suffered the need for high voltages and inductive current limiting. This made it impractical to directly drive gas-discharge display devices from modern solid state electronics.

The modern development of fluorescent displays has solved the parallax and high-voltage problems of the gas discharge display devices while requiring the solution of a number of problems of its own.

A fluorescent display device may use a filament, heated to below incandescent temperature, as a source of thermionic electrons which are then accelerated toward an anode coated with a phosphor capable of fluorescing under bombardment by low-energy electrons. The accelerating voltage can be from a few volts to hundreds of volts but is preferably in the range of from 10 to 30 volts. By selectively accelerating thermionic electrons to desired regions of the phosphor-coated anodes, a bright changeable planar display is achieved. Alternatively, a gas-discharge fluorescent display uses an anode screen superposed in the line of sight between the viewer and phosphor coated segmented cathodes. Impingement of positively charged gas ions disassociated by the electric field between anode screen and cathodes, excites the phosphor into illumination.

In the remainder of this specification, unless otherwise noted, the description will be directed to a vacuum fluorescent display device. One skilled in the art would readily apply the teaching to gas discharge display devices.

It was discovered by R. DuBois that natural electrostatic charges, such as from a comb running through a person's hair and brought into proximity of a vacuum fluorescent display of the type described, could completely extinguish the display for an extended time. His solution, disclosed in U.S. Pat. No. 3,584,252, consisted in partially encircling the anode with a conductive electrostatic shield.

A second problem of unequal illumination of the anode by thermoelectrons has engendered a number of solutions. The problem arises because a convenient method of fabrication includes an insulating substrate, usually glass, behind or embedding the anodes. Charges stored in the insulating substrates so distort the electric field within the vacuum fluorescent device that widely variable illumination of the phosphor occurs. Solutions by R. Raago in U.S. Pat. No. 3,780,326 and by S. Shimada in U.S. Pat. No. 3,668,446 taught the use of an auxiliary electrode in substantially the same plane as the anodes. Application of the correct voltages on the auxiliary electrode could adjust the electrostatic field to achieve uniform illumination or alternatively could extinguish the device. R. Raago in U.S. Pat. No. 3,688,147 solved the problem in a different way by spacing the anode segments on cantilevers far enough forward from the insulating substrate to avoid the distortion of the electrostatic field from charges stored in the insulator. Still another solution, disclosed in varying forms by M. Tanji in U.S. Pat. Nos. 3,619,694 and 3,508,101 and by R. DuBois in U.S. Pat. No. 3,566,187 uses a mesh grid interposed between the filament and the anodes operating in a fashion analogous to a normal electron-tube screen grid to accelerate electrons toward the anode using positive voltage or to cut off electron flow of the anode using negative voltage. Proper adjustment of the positive voltage on the grid was effective to cancel the effect of charges stored in the insulating substrate. In addition, the grid shields the anodes from external electrostatic disturbances.

In order to simultaneously display an array of changeable symbols, devices have appeared which employ a plurality of identical symbols side by side. The large number of individual parts to be assembled in such devices significantly increases the cost of manufacture. One approach to reducing the assembly cost is shown in U.S. Pat. No. 4,047,073 which uses a grid frame to initially hold and position a number of internal components. The grid frame extends laterally through the seal and is later cut off leaving legs which are subsequently used as leads. The lateral extension of the leads adds undesirably to the profile of the overall device.

SUMMARY OF THE INVENTION

The present invention teaches a vacuum fluorescent display device containing a thermionic filament heated to below incandescent temperature spaced from at least one phosphor-coated anode which glows when bombarded with electrons. A foraminous charge-control electrostatic lens is spaced at the other side of the thermionic filament from the anode. The phosphor coating glows when bombarded by thermionic electrons accelerated toward it by positive bias with respect to the filament. The foraminous charge-control electrostatic lens connected to a source of positive potential, adjusts the electrostatic field within the display device to achieve uniform illumination of the anode. The glowing anode is viewed through the openings in the foraminous electrostatic lens. In one embodiment, the foraminous electrostatic lens is specularly reflecting and is covered by a circular polarizer.

The invention also contemplates placing the foraminous screen between the filament and the anodes.

In the present invention, a glass substrate is cast on a plurality of leads and supports at least some of which extend outward from the substrate normal to the rear surface thereof. This permits directly plugging the display device into a socket behind it without wasting peripheral space about the face of the display. The inner ends of the plurality of leads and supports may be directly employed as electrodes, such as shaped anodes, or may be connected to separately formed electrodes such as anodes, grids, filaments or getter bars inside the device.

It is a convenient advantage to initially form a group of leads and supports in a set connected together and relatively positioned by an integral header bar. The connected set holds all leads and supports in accurate relative alignment while the vitreous substrate is cast about them. After the substrate is solidified, the header bar is trimmed away leaving the leads securely retained and accurately aligned. More than one header bar, either separate or connected, may be employed to position and hold the leads and supports in any desired pattern until the substrate is cast and solidified.

Multi-indicia fluorescent display devices are customarily made using a layer of printed interconnect wires on the substrate and a patterned insulating layer of, for example, glass atop the interconnect wires. The pattern of the insulating layer contains openings, sometimes walled vias, to permit electrical connection through the insulating layer to specific areas, such as leads and printed wires, underneath. Patterned conductive anodes of metal but preferably of carbon are formed in a desired multi-indicia anode pattern on the insulating layer and phosphor is coated on at least part of the anode pattern. Separate control grids, which may be accelerating grids, retarding grids, space charge grids or operating on other principles are spaced above each set of anodes which form a changeable character. Independent voltage control of each grid permits simultaneous extinguishment of the phosphor on all of the related anode segments of a character regardless the pattern of energization or non-energization set up by the existing voltages on the individual anodes forming the changeable character.

Control grids thus employed permit multiplexing of the characters. That is, each character in turn is enabled by its control grid to display the particular pattern set up by the pattern of energization of its anode segments. All other characters remain extinguished during this time. When the next character is enabled by its control grid, the character previously enabled is extinguished by its control grid. Since the characters are illuminated one at a time, if a number of characters have identical anode patterns, there is no need to provide individual anode leads to every anode. Instead, corresponding anodes for each identical character may be connected together, for instance by the printed wires on the substrate. As a particular character is enabled by its control grid, the energization pattern of all anodes is established to produce the desired illuminated character. Only the enabled character will be illuminated.

Multiplexing achieves a significant reduction in external connections in a fluorescent display device. For example, a 9-character display of 7-segment characters contains 63 anode segments. Without multiplexing, 63 separate leads are required for control of the anodes. With multiplexing, only 16 leads, 7 ganged to corresponding segments in all characters and 9 connected to control grids over the 9 individual characters, are required to energize and control the anodes. Additional leads for other elements such as filaments and getters are required in either case.

The preferred method of forming the printed wires, patterned insulating layer, anode segments and phosphor coating is by silk screening. The steps of depositing the several layers involved are separated, in most processes by drying or baking to harden or cure the previously formed material before adding the next layer. Silk screening requires a substantially flat surface against which the silk screen stencil can be placed in order that the material to be applied to the substrate can be squeezed through the meshes of the pervious part of the silk screen directly into contact with the surface. The silk screen is relatively flexible and therefore does not require a perfectly flat surface against which to work. It can accommodate minor bumps and depressions. However, satisfactory silk screening is not possible where protuberances hold substantial areas of the silk screen out of contact with the substrate or puncture its relatively delicate fabric.

In the prior art, the substrate begins as a plane sheet of glass or ceramic. The silk screened patterns are therefore readily applied to its plane surface. In contrast, the present invention employs a glass substrate which is cast on pins, supports and other elements which pass through the plane surfaces of the substrate. In the case of certain embodiments such as grid holders and cathode holders, elevation of the inner end a substantial distance above the substrate is desirable or necessary. This would, of course, preclude silk screening except for the disclosure of the present invention.

According to the present invention, all elements which protrude a substantial distance beyond the upper surface of the substrate are intially bent flat against the substrate so that they lie close and parallel to the top surface of the substrate or are partially embedded therein during casting of the substrate leaving at least their upper surfaces exposed. The elements can be bent over either before or after casting the substrate but are preferably bent over before. The elements above the substrate can be flattened to make them conform even closer to the substrate. Conforming substantially to the surface of the substrate in this way, the elements therefore represent no more than minor bumps on the substrate. Silk screening of printed wires, insulating layers, anode and phosphor patterns are performed on the substrate uninterfered with by the bent over elements. The printed wires may directly contact particular ones of the bent over elements to provide electrical connection therefrom from external pins.

After the completion of all printing and curing operations on the substrate, selected ones of the bent over elements may be bent upright to perform their function, or to receive other elements to be attached to them. In the most preferred embodiment, some of the elements extend parallel to the front surface of the substrate outward beyond the edge of the substrate. The overhanging portions are convenient to provide access for bending upward. In addition, the overhanging portions can provide a means for indexing automatic machinery which bends the elements into their upright positions and/or attaches other elements by any suitable means but most preferably by resistance welding.

BRIEF DESCRIPTION OF THE DRAWINGS

FIG. 18 shows a plan view of a cover plate.

FIG. 19 shows a cross sectional view of a cover plate taken along 19—19 in FIG. 18.

DETAILED DESCRIPTION OF THE PREFERRED EMBODIMENT

Figure 1:
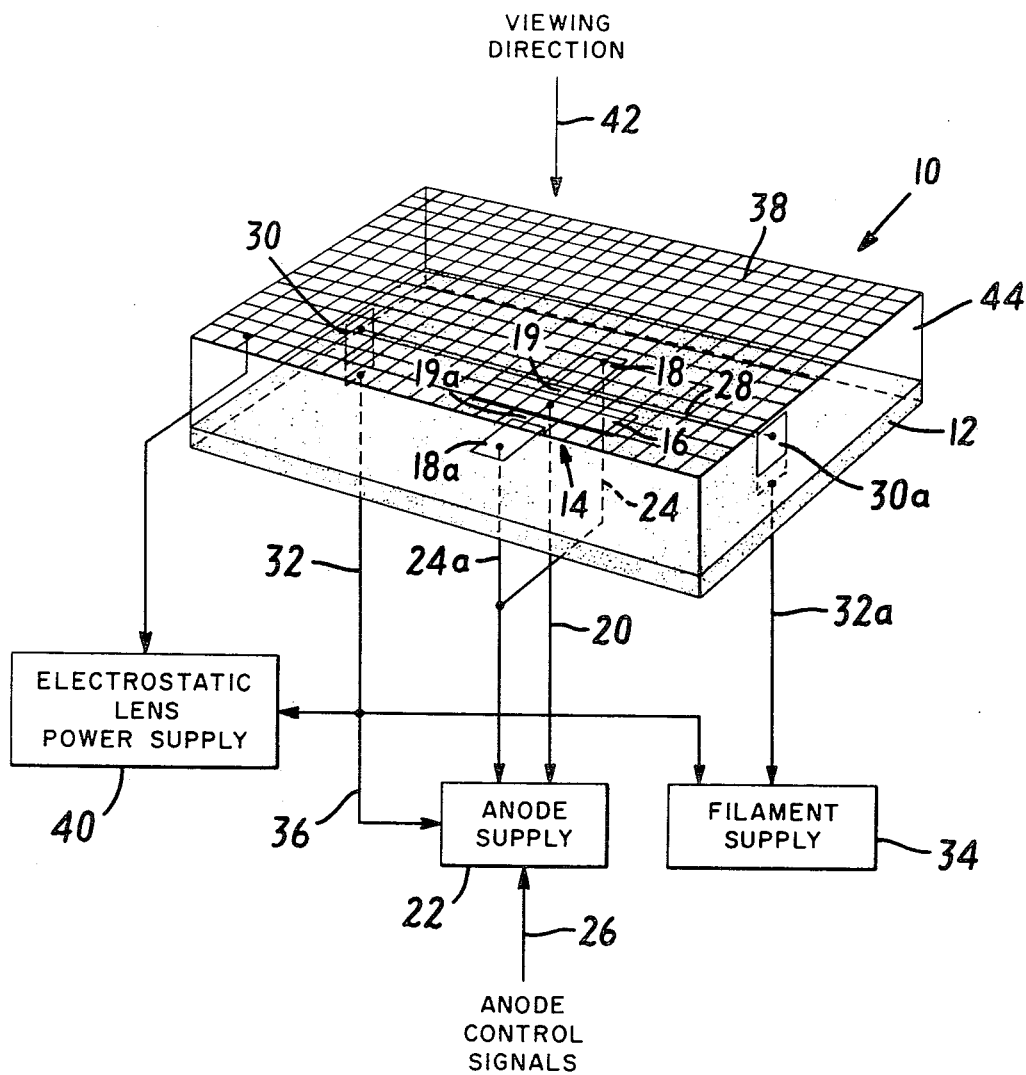
FIG. 1 shows a ghost pictorial perspective view of one embodiment of a vacuum fluorescent display device and a block diagram of power supplies therefor according to the teachings of this invention.

A vacuum fluorescent display device 10 according to the teachings of the present invention is shown in FIG. 1. A substrate 12 of insulating material, such as glass or ceramic, has a shaped phosphor-coated conductive anode 14 upon or embedded within it. The phosphor coating on the conductive anode 14 is applied using any method such as masked spraying or brushing but is preferably silk screened. The conductive anode 14 may be of any conductive planar shape and may comprise a single conductive region or it may be divided into independently controllable subregions of any shape. In the figure, the anode 14 is shown to comprise a + shape, for purposes of illustration, made up of a horizontal bar 16 and two vertical half-bars 18, 18a. Each vertical half-bar 18, 18a is separated from the horizontal bar 16 by an insulating gap 19, 19a. An electrical conductor 20 passes sealably through the substrate 12 electrically connecting the horizontal bar 16 to one output of an anode supply 22. Similarly, electrical conductors 24, 24a pass sealably through the substrate 12 electrically connecting the vertical half-bars, 18, 18a to the anode supply 22. It will be evident to one skilled in the art that any anode pattern can be formed and independently connected to the anode supply 22. The anode supply 22 is capable of independently controlling the application of accelerating voltages to the parts of the anode 14 according to anode control signals 26 received from anexternal source, not shown. Thus, the anode segments 16, 18, 18a can be energized in any desired pattern under the control of the anode control signals 26 as will be described.

One or more heater filaments 28 (only one is shown) preferably in the form of a fine wire is suspended above the anode 14 by two filament supports 30, 30a. The heater filament 28 is treated with a rare-earth oxide coating or by other methods known or which become known to enable it to emit thermoelectrons at dull red color or cooler. Filament leads 32, 32a sealably penetrate the substrate 12 connecting the filament supports 30, 30a to a filament supply 34.

A reference signal 36 is connected from filament lead 32 to the anode supply 22. When a positive voltage with respect to the reference signal 36 is connected to one or more segments of the anode 14, thermoelectrons are accelerated toward those segments of the anode 14. When a negative or neutral voltage is connected to certain anode 14 segments, thermoelectrons are not accelerated toward those anode 14 segments. The phosphor coating on the positively biased anode 14 segments glows under the bombardment of the thermoelectrons whereas the negatively biased segments remain dark. Thus, a variable illuminated pattern can be set up in the anode 14 by selection of those segments to be positively and negatively biased.

Due to the electrostatic charge distribution set up in the substrate 12 and also due to external electrostatic fields, a vacuum fluorescent display device 10 containing only the elements heretofore described will display segments of variable brightness and will be subject to electrostatic disruption of the display. An electrostatic lens 38 connected to an electrostatic lens power supply 40 adjusts the electrostatic field within the display device 10 to overcome the internal electrostatic charge distribution and also shields the filament 28 and anode 14 from external electrostatic disturbances. The electrostatic lens 38 is a transparent conductive surface or a foraminous screen placed in the line of sight 42 either above or below the filament 28 between the viewer and the illuminated segments of the anode 14.

A cover 44 having a transparent portion at least in the line of sight 42 is sealed to the substrate 12. The cover 44 and substrate 12 together form a hermetically sealed enclosure within which the anode 14 and the filament 28, with associated parts, are contained. The electrostatic lens 38 is inside the cover 44 to avoid interference from a charge gradient which may be set up across the cover 44. The hermetically sealed enclosure is evacuated to a hard vacuum between $10^{-6}$ and $10^{-9}$ torr using methods well known in the art.

Figure 2:
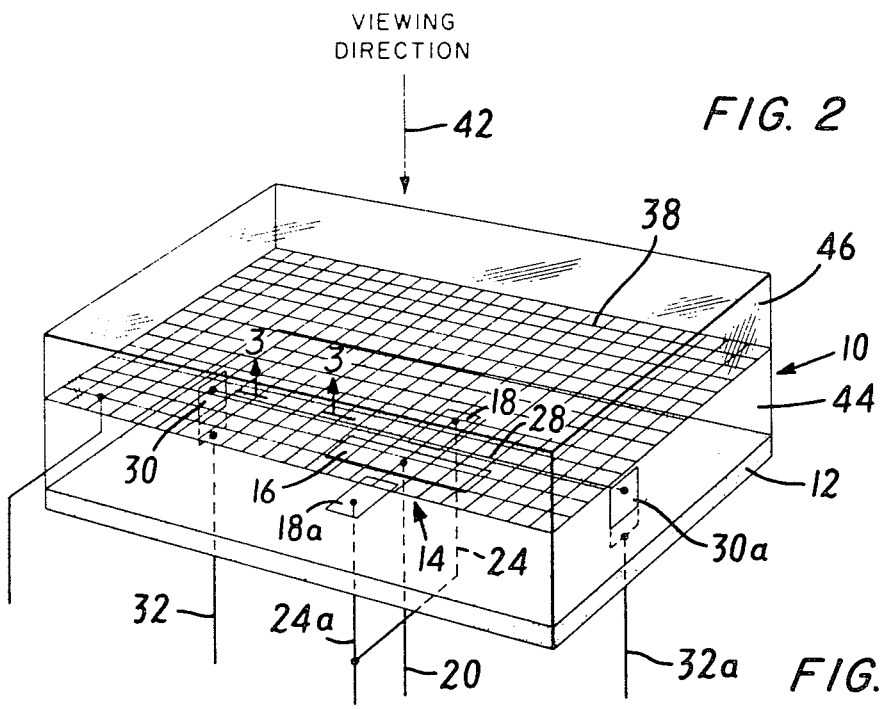
FIG. 2 shows an embodiment of the present invention which includes a contrast enhancement device.

Referring now to FIG. 2, there is shown a second embodiment of the invention containing a circular polarizer 46 interposed in the line of sight 42. As is explained in U.S. Pat. No. 3,682,531, which is incorporated herein by reference, the interposition of a circular polarizer in the line of sight to an internally illuminated display enhances the contrast of the display by trapping incident light while permitting the exit of internally generated light relatively unattenuated.

Figure 3:
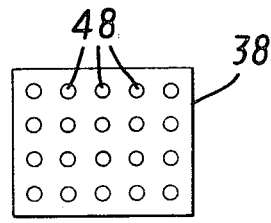
FIG. 3 shows a close up view of one embodiment of the foraminous screen taken along 3—3 in FIG. 2.

In FIG. 3, an embodiment of the electrostatic lens 38 which may advantageously be combined with the circular polarizer 46 shown in FIG. 2 to yield an additional contrast enhancement. The electrostatic lens 38 is a foraminous screen containing a plurality of holes 48. The holes may be in any shape and regular placement but their area, or openness, should comprise from about 10 to about 70 percent, but best contrast enhancement is obtained with hole openings in the range of from about 20 to about 50 percent of the screen area. The preferred range of hole spacing is from about 100 to about 750 lines per inch. The holes may be located at the corners of right squares as in FIG. 3 or may be along skewed or curved lines. For contrast enhancement with the circular polarizer 46, the side of the foraminous screen 38 nearest the viewer is specularly reflecting. The theory whereby specular reflection in the foraminous screen 38 enhances optical contrast is covered in detail in U.S. Pat. No. 3,682,531. The foraminous screen 38 is made of electrically conductive material and is electrically connected to the electrostatic lens power supply 40 as shown in FIG. 1.

Figure 4:
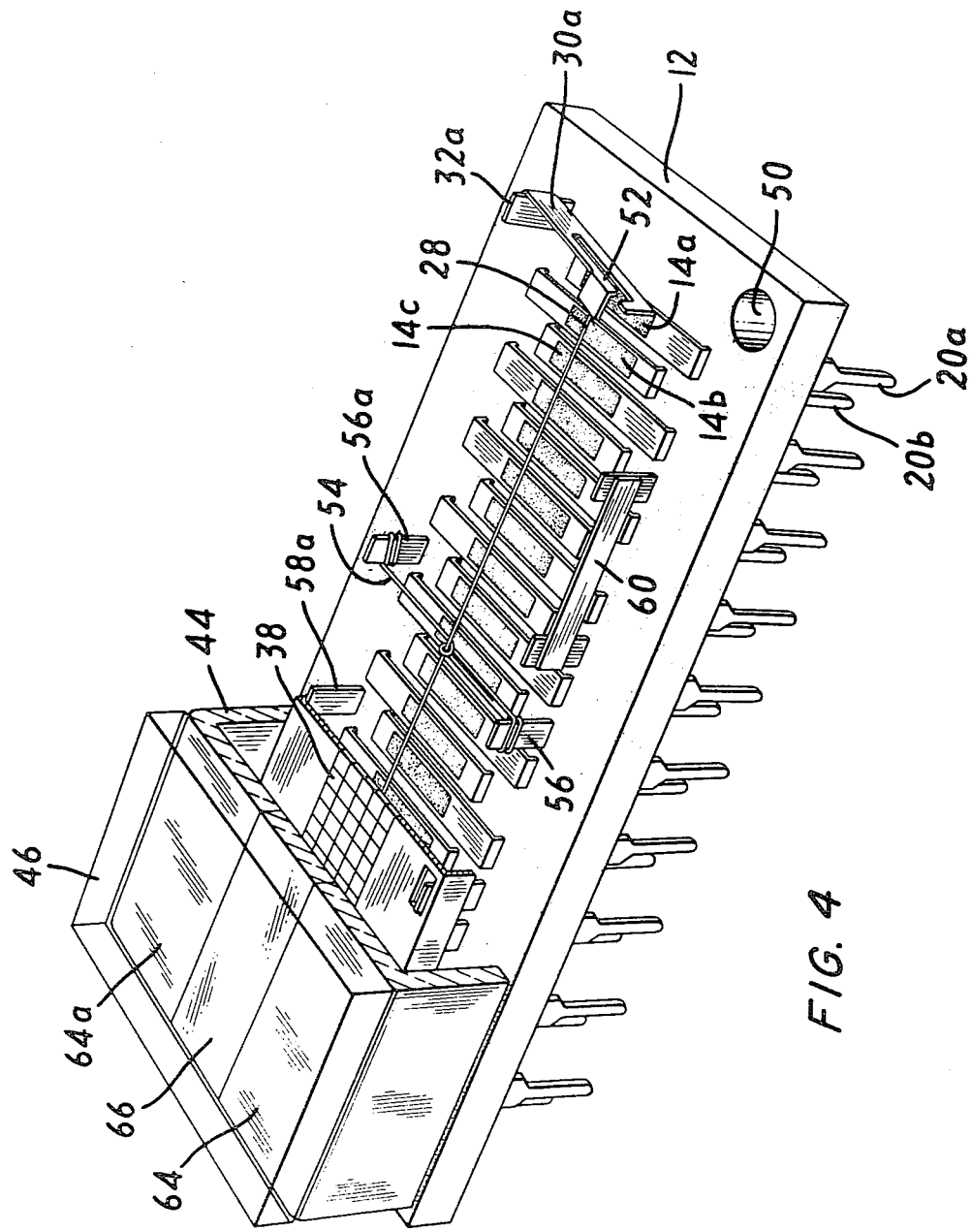
FIG. 4 shows an embodiment of the present invention especially adapted to use as a linear scale indicator.

An embodiment of the invention especially adapted to use as a linear scale indicator is shown in FIG. 4. Linear scale indicators are advantageously employed in aircraft, automotive and other applications to indicate the status of measured parameters by the length of an illuminated line.

The substrate 12 is in the shape of a rectangular plate made of a suitable glass or ceramic material but preferably is of black glass due to the fact that it absorbs incident light. An evacuation opening 50 passes through the substrate 12 and is used in a manner well known in the art during the process of evacuating the enclosure. A plurality of bar-shaped anodes 14a, 14b, etc. are disposed in a contiguous parallel array. The anode is partially embedded in the glass substrate 12 and is further retained in position by the passage through the substrate of electrical conductors 20a, 20b, etc. The electrical conductors 20a, 20b, etc. are conveniently shaped at their outer ends for insertion into standard electrical connectors. Alternatively, the electrical conductors 20a, 20b, etc. may be of wire or may have solder fittings adapted to electrical connection by other conventional methods.

The filament supports 30, 30a (30 is hidden) are supported and power is supplied through filament leads 32, 32a. A flat filament tensioning spring 52 applies endwise force to the filament 28 to prevent sagging. The filament may also be supported in its run by a filament support wire 54 which extends laterally from pegs 56, 56a. The foraminous screen 38 is placed above the filament on support legs 58a (the remaining support legs are not shown). At least one of the support legs 58a extends through the substrate 12 and provides external connection for the control voltage. Thus, connection of the foraminous screen 32 to the control voltage performs the functions of the electrostatic lens previously described. A non-flashing or flashing getter bar 60 is supported within the enclosure on a pair of getter bar support legs 62, 62a which provide external electrical connection, not shown. The non-flashing getter bar 60 is used in the final stages of evacuation of the enclosure in a manner well known in the art.

The box shaped cover 44 preferably formed of glass is sealably attached to the upper perimeter of the substrate thereby forming the hermetically sealed enclosure. The outer regions 64, 64a of the glass cover 44 may optionally be blackened to prevent the lateral entry of extraneous light. A rectangular shaped central clear region 66 allows viewing of the illuminated anodes 14a, 14b, etc. through the openings in the foraminous screen 38.

The foraminous screen 38, instead of being independently formed and supported on support legs 58a, could alternatively be produced as a plating photo chemically formed upon the inner surface of the cover 44 with electrical connection to the exterior provided by conventional means.

The circular polarizer 46 may be installed on top of the cover 44 covering at least the clear region 66. Alternatively, the cover 44 may itself be fabricated in such a manner that it, itself, performs the function of a circular polarizer. For best results, the contrast enhancement device described in U.S. Pat. No. 3,682,531 requires that the foraminous screen 38 should be specularly reflecting on its side facing the circular polarizer 46 and that there should be no intervening diffusive or further retarding means interposed between them. Although the presence of the clear glass region 66 between the circular polarizer of the foraminous screen as shown in FIG. 4 somewhat degrades the performance of the contrast enhancement device, the applicant has discovered that the degradation is of acceptable degree.

Figure 5:
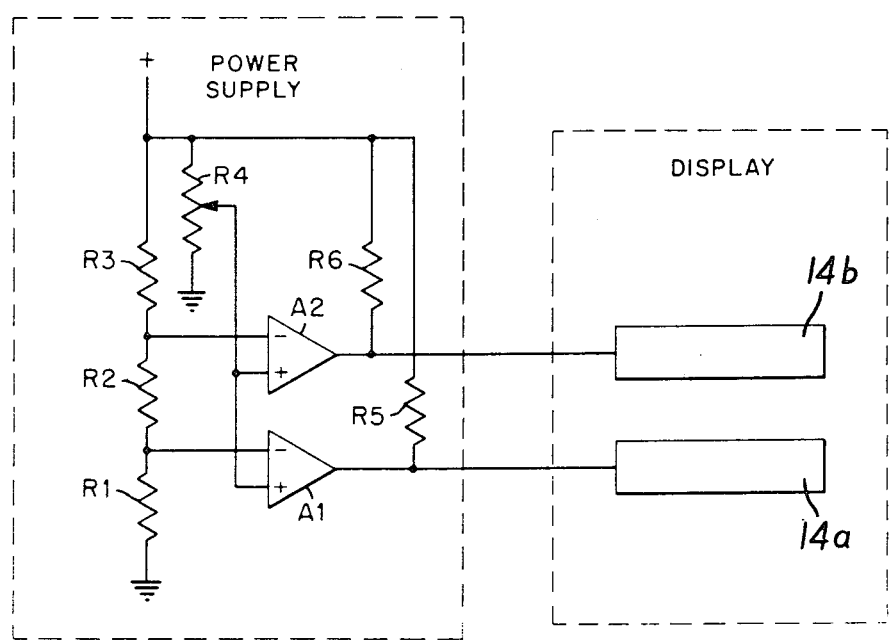
FIG. 5 shows a simplified schematic diagram of a power supply for a linear scale indicator of the type shown in FIG. 4.

A portion of an analog to digital anode supply 22 is shown in FIG. 5. For simplicity of description only two anodes 14a and 14b are shown with the associated supply components. It will be understood that the number of anodes may be increased to a larger number with each additional anode requiring the addition of a modular set of supply components as shown in FIG. 5. A resistive voltage divider composed of resistors R1, R2 and R3 between the positive supply voltage and ground provides inputs to the negative input terminals of voltage comparators A1 and A2. The second input to the voltage comparators A1, A2 is provided in parallel from a device which generates a measured voltage to be indicated on the display. For purposes of illustration the measured voltage-generating device is shown as a variable resistor R4. Resistors R5 and R6 between the outputs of A1 and A2 respectively and the positive supply allow the zero outputs of A1 and A2 to clamp the voltage at anodes 14a and 14b to ground. Assuming essentially that the wiper of variable resistor R4 is at its ground end, the voltage fed to the input of A1 from variable resistor R4 is less positive than the voltage at the junction of voltage divider resistors R1 and R2. Consequently, voltage comparator A1 provides a zero output to anode 14a. Similarly, voltage comparator A2 provides a zero output to anode 14b. As the wiper of variable resistor R4 is moved towards its positive end, when the voltage thus supplies to voltage comparator A1 just exceeds the voltage at the junction of voltage divider resistors R1 and R2, the output of voltage comparator A1 switches abruptly from zero to positive voltage. Anode 14a thereupon becomes positive, attracts thermal electrons from the filament and begins to glow. The positive voltage at the input of voltage comparator A2 from the junction of the divider resistors R2 and %2, being more positive than the voltage fed to voltage comparator A1, retains voltage comparator A2 in the cutoff condition providing a zero output to anode 14b. As the wiper of variable resistor R4 continues to be moved towards its positive end, when the voltage thus fed to voltage comparator A2 exceeds the voltage at the junction of voltage divider resistors R2 and R3 the output of voltage comparator A2 abruptly changes from zero to positive thereby illuminating anode 14b. Additional anode sections 14c, 14d, etc. can be accommodated by adding one additional voltage divider resistor, voltage comparator and resistor on the output for each section to be added. If all corresponding resistors have the same value, the voltage resolution of the indicator equals the total voltage divided by the number of anode segments. The response of the indicator can be made stepwise non-linear to approximate any desired mathematical curve by suitably choosing the values of the voltage divider resistors.

Figure 6:
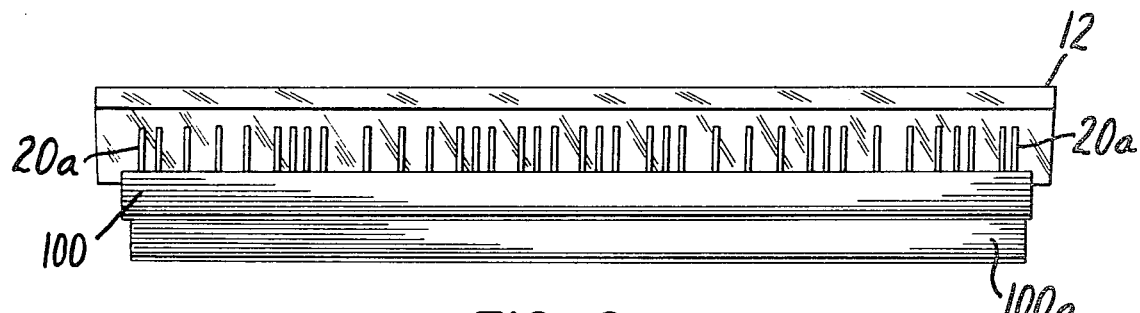
FIG. 6 shows a side view of the substrate including the pins and supports connected together at their outboard ends by a header bar.

Referring now to FIG. 6, there is shown the electrical conductors 20a, etc. joined together by a header bar 100 with which the pins are integrally formed. The header bar and pins are clamped in a mold and the molten glass to form the substrate 12 is poured into the mold thereby air tightly embedding the pins in the substrate with the upper ends of at least some of the pins protruding above the substrate.

In the embodiment shown in FIG. 6, the pins connected to header bar 100 form a straight line accurately positioned with respect to each other. When the header bar is subsequently removed by means well known in the art, the pins are accurately indexed for fitting into a mating socket, not shown. A second header bar 100a may also be employed integrally formed with its set of pins to provide an additional set of external pins and internal electrodes and supports.

Figure 7:
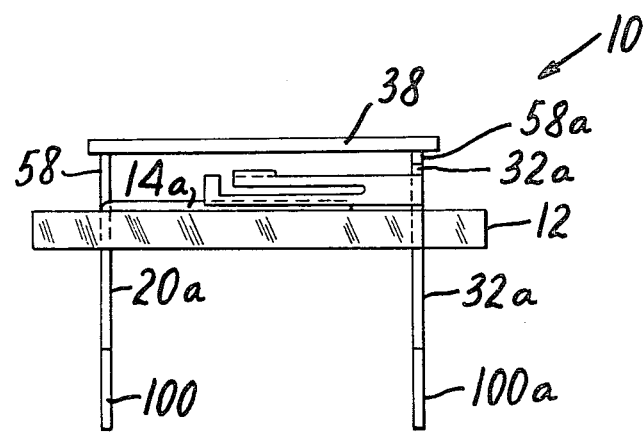
FIG. 7 shows an end view of an assembled vacuum fluorescent display device assembled using the header bars and substrate of FIG. 6 before the cover is installed.

FIG. 7 shows an end view of an assembled vacuum fluorescent display device 10 omitting the cover 44 and before the header bars 100, 100a are removed. Note that the phosphor covered anode 14a is bent flat against or partially or wholly embedded within the substrate 12. In this embodiment the foraminous screen 38 is a rigid self supporting plate which is affixed atop the support legs 58, 58a by means well known in the art such as resistance welding.

Casting of the substrate 12 over the pins is most conveniently performed when all of the pins form one or more straight lines as shown in FIG. 7.

Figure 8:
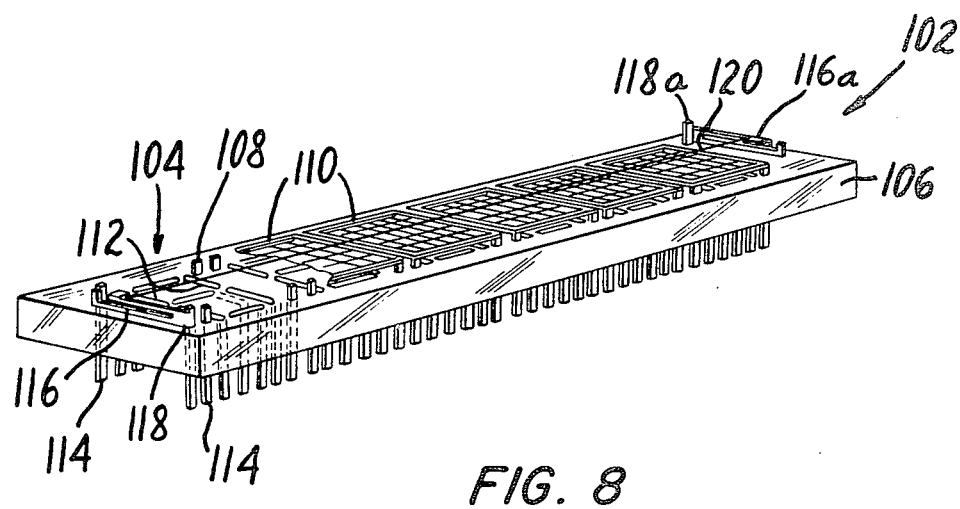
FIG. 8 shows a six character display according to the invention.

FIG. 8 shows a six character display 102 employing six 7-segment numeric characters 104 aligned side-by-side on a cast substrate 106. A plurality of grid supports 108 are cast into the substrate 106 at the time it is formed. In the embodiment shown, four grid supports per character 104 located adjacent the four corners of the character are provided. A foraminous grid 110 is attached to the top of the grid supports spaced away from the anode segments 112 on the substrate. Two straight rows of pins or supports 114 provide connection through the substrate from each anode segment 112 and grid 110 to pins or supports external to the substrate as previously described. Filament supports 116, 116a at opposed ends of the substrate are similarly supported on filament support pins 118, 118a. A filament 120 is streched between the filament supports 116, 116a and is fed electrical power through filament support pins 118, 118a.

Note that the embodiment in FIG. 8 employs a filament which is above the grids 110. This placement is convenient for multiplexing purposes as previously described.

When advantage is not taken of the contrast enhancement using a circular polarizer and a specularly reflecting foraminous screen, more efficiency is obtained when the openness of the grids 110 is increased. A grid openness of 20-97% and preferably from 70-95% is desired with best operation occurring with a grid openness of 85-92%.

Figure 9:
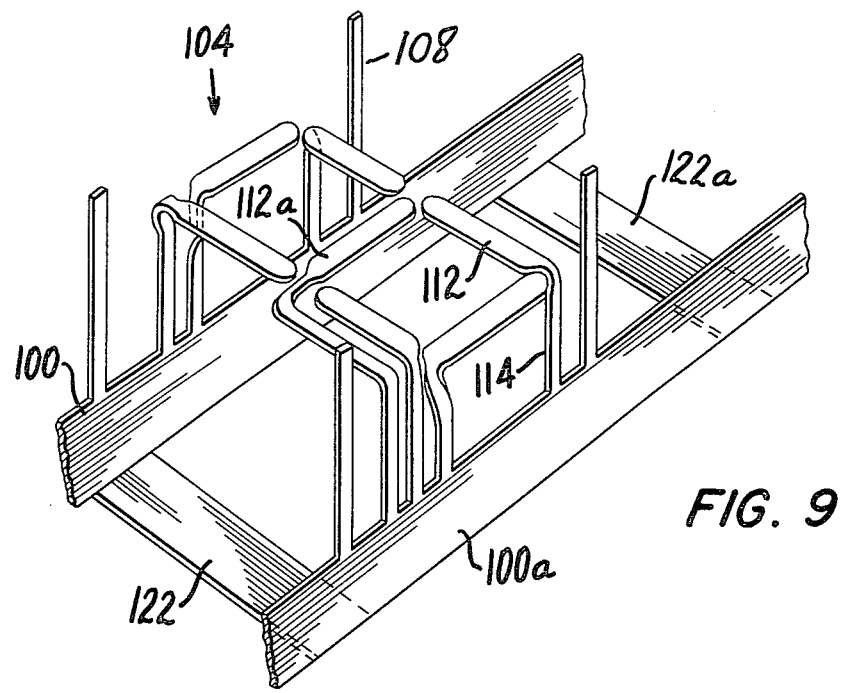
FIG. 9 shows a fractional perspective view of a set of anode segments integrally formed with their support pins and connected to header bars.

One way that the header bars 100, 100a pins or supports 114 and grid supports 108 may be integrally formed with anode segments 112 is shown in FIG. 9. Header bars 100 and 100a are integrally formed with connector rails 122, 122a in a single unit which includes pins 114, grid supports 108 and anode segments 112. The anode segments 112 are bent, preferably before casting of the substrate, not shown, in FIG. 9 to form the pattern desired. For example, the 7-segment numeric character 104 can be formed with 7 anode segments 112, three of which are connected to header bar 100 and the other four are connected to header bar 100a. The center bar 112a anode segment requires two right angle bends to dispose it in the proper location. When the substrate, not shown, is cast, the molten glass preferably embeds the lower portion of the anode segments 112 to firmly secure them in place. The grid supports 108 may extend above the surface of the substrate to permit spacing of the grid, not shown, above the anode segments 112.

The use of connector rails 122, 122a ensures accurate registration of all pins or supports 114 and grid supports 108 prior to casting the substrate. Once the substrate is cast and solidified, header bars 100 and 100a as well as connector rails 122, 122a can be removed from pins or supports 114 and grid supports 108 by means well known in the art. Thereupon, pins or supports 114 and grid supports 108 are available for use as connector pins for plugging into the terminals of a socket, not shown.

For manufacturing convenience, connector rails 122 and 122a may connect header bars 100 and 100a at extensions of header bars 100 and 100a which extend beyond the end perimeter of the display device.

The embodiment shown in FIGS. 8 and 9 are especially suited to independent, continuous control of each anode segment 112. In order to take advantage of the interconnect efficiency offerred by multiplexing, some means must be provided for connecting together corresponding segments of all characters 104. In addition, the fact that grid supports 108, filament support pins 118, 118a and other elements extend a substantial distance above the substrate prevents effective use of silk screening to apply phosphor to the anode segments 112 or for other purposes.

Figure 10:
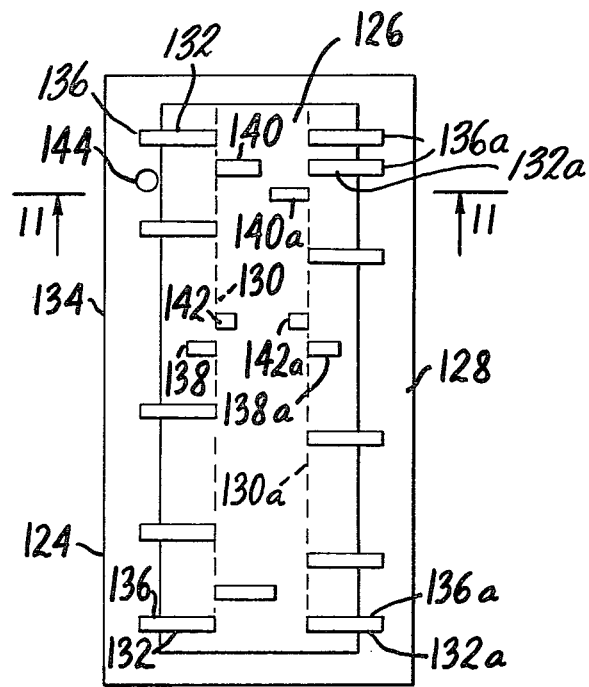
FIG. 10 shows a plan view of a substrate having pins bent flat against the substrate.
Figure 11:
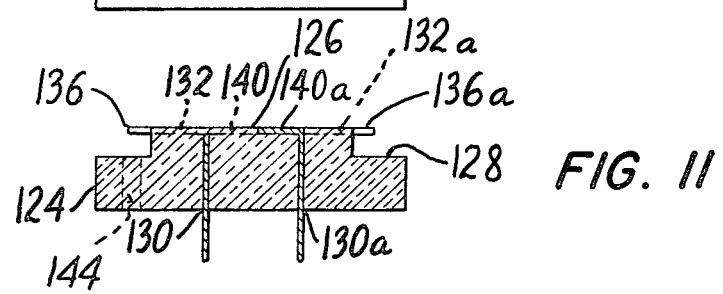
FIG. 11 shows a cross section taken along 11—11 in FIG. 10.

A further improved embodiment of the invention is shown in FIG. 10 and FIG. 11. A stepped cast substrate 124 has a plane plateau surface 126 surrounded by a depressed sealing ledge 128. Two rows of pins and supports pass through the substrate along straight lines shown as dashed lines 130 and 130a. The upper ends of all pins are bent substantially flat against the plateau surface 126 laterally from their penetration point through lines 130, 130a.

Some of the pins 132, 132a are bent outward toward the perimeter of the substrate 134. These pins 132, 132a are long enough to provide an overhanging end part 136 cantilevered over the depressed sealing ledge 128.

Other outward bent pins 138, 138a may be provided. The other outward bent pins 138, 138a are too short to hang cantilevered over the depressed sealing ledge 128. The other outward bent pins 138, 138a may optionally be partially embedded within the plateau surface 126 with their upper surfaces exposed as shown. Long inward bent pins 140, 140a and short inward bent pins 142, 142a are similarly provided and optionally partially embedded within the plateau surface. The reason for having long and short inward bent pins 140, 140a, 142, 142a will become apparent in subsequent description.

An evacuation opening 144 is optionally located in the depressed sealing ledge adjacent the plateau surface 126.

As most clearly shown in FIG. 11, the plateau surface 126 with the various pins bent flat against it presents a substantially planar surface which permits the use of silk screen for depositing materials upon it in subsequent operations as will be described.

Figure 12:
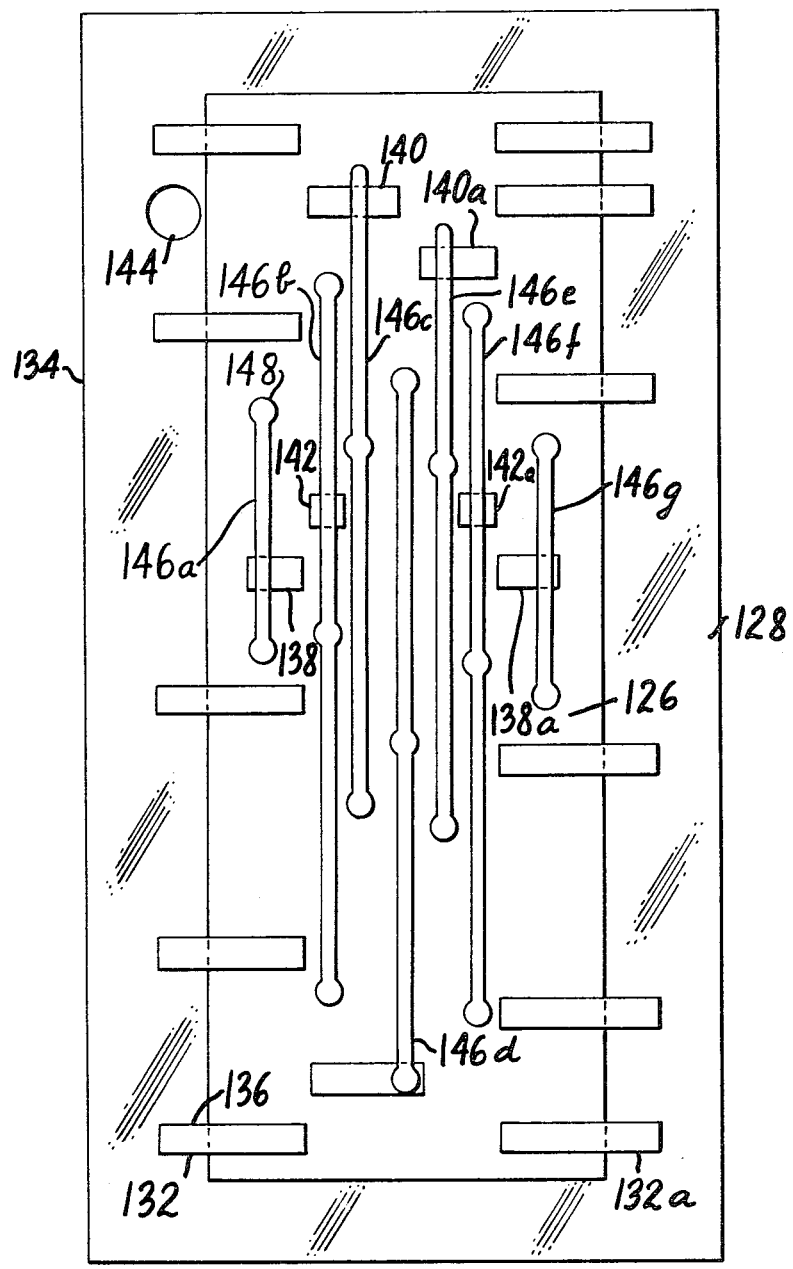
FIGS. 12-15 shows steps in the interconnecting and depositing anode segments on the substrate.

Referring now to FIG. 12, the next step in the fabrication of the vacuum fluorescent display device according to this embodiment of the invention beginning from the condition shown in FIGS. 10 and 11 is shown. A plurality of conductive stripes 146a–146f are deposited on the plateau surface 126 by any convenient means known in the art but preferably by silk screen printing. Each conductive stripe 146 makes electrical contact with at least one of the overhanging pins 132 or 132a, one of the other outward bent pins 138, 138a or one of the long or short inward bent pins 140, 140a, 142, 142a. For example, conductive stripe 146a is shown intersecting outward bent pin 138. Thus, the voltage at all points along conductive stripe 146a is determined by the voltage connected to outward bent pin 138. The voltage connected to outward bent pin 138 is, of course, controlled by a voltage connected to the external portion of the pin, not shown in FIG. 12.

It should be noted in FIG. 12 that the use of outward bent pins 138 combined with two lengths of inward bent pins 142, 140 permits straight lines of conductive stripes 146a–146c to be laid down upon the plateau surface 126 without any of the conductive stripes 146a–146c intersecting more than one pin. It would be clear to one skilled in the art that the conductive stripes need not be in straight lines but may be curved in any fashion provided that electrical contact is made with the appropriate bent pin.

Connection pads 148 appear as generally circular enlargements on the conductive stripes 146a–146f. The connection pads 148 are located for connection to other elements in subsequent steps of the assembly process as will be explained.

Figure 13:
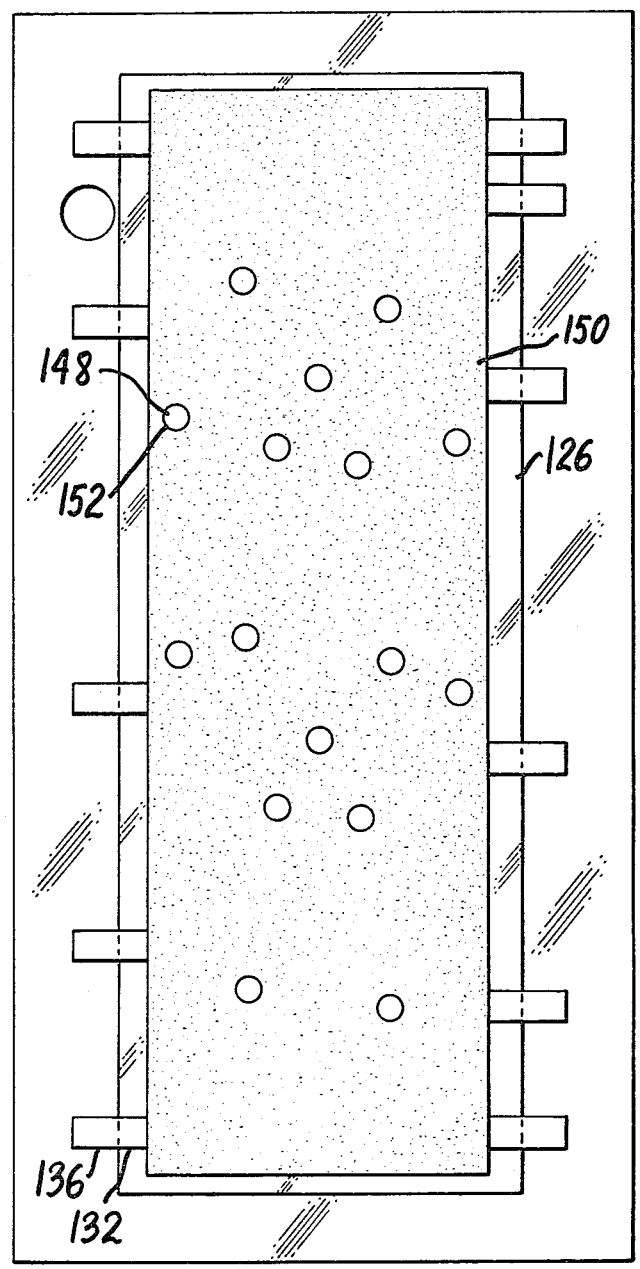

Referring now to FIG. 13, an insulating layer 150 is deposited on a portion of the plateau surface 126 covering and insulating at least the areas thereof occupied by the conductive stripes 146a–146f except for openings or vias 152 coinciding with the connection pads 148. Thus, the connection pads 148 remain exposed through the insulating layer 150. The insulating layer 150 may be applied by an means known in the art but is preferably applied using silk screening.

Figure 14:
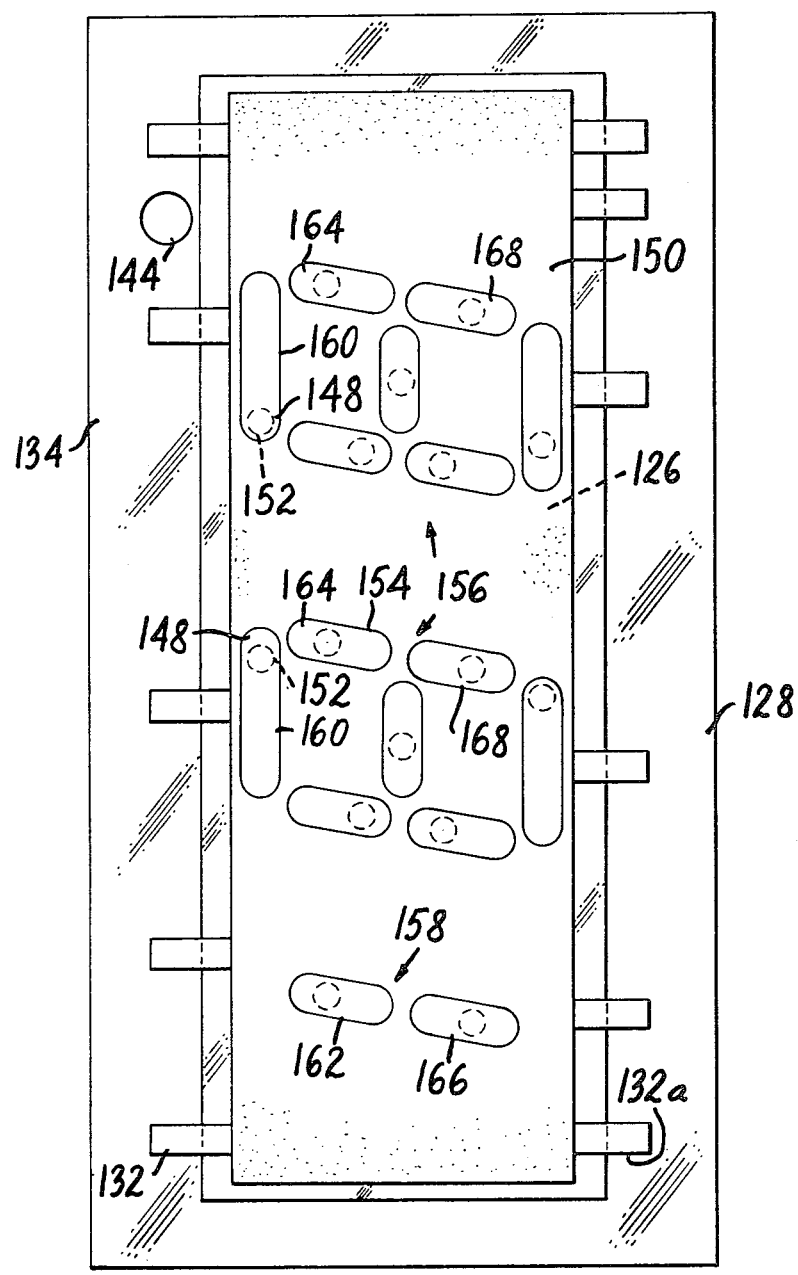

Referring now to FIG. 14, a plurality of conductive anodes 154 are deposited over the insulating layer 150. Each conductive anode 154 intersects a via 152 which provides connection through the insulating layer 150 to the appropriate conductive stripe 146a–146f (see FIG. 12) beneath the insulating layer 150. The conductive anodes 154 may be of any conductive material such as aluminum or gold but are preferably of finely divided carbon bonded together in a matrix to form the shapes of the conductive anodes 154.

It will be noted that conductive anodes 154 are organized in patterned groups such as the two figure eight patterns 156 and the stripe pattern 158.

Corresponding conductive anodes 154 of the two figure eight patterns are connected together by the pattern of conductive stripes 146a–146f below the insulating layer 150. For example, the two top bars 160 of the two figure eight patterns 158 are connected together through vias 152, connection pad 148 and conductive stripe 146a, see FIG. 12. In addition, the upper bar 162 of the stripe pattern 158 is connected to each of the upper right bars 164 of the two figure eight patterns 156. Also, the lower bar 166 is connected to the lower right bar 168 of the two figure eight patterns 156. Although the stripe pattern 158 and the figure eight patterns 156 are different, this does not interfere with successful multiplexing of the two types of anode patterns. This is possible because only one of the anode patterns is illuminated at a time and the others are held extinguished as previously described.

Figure 15:
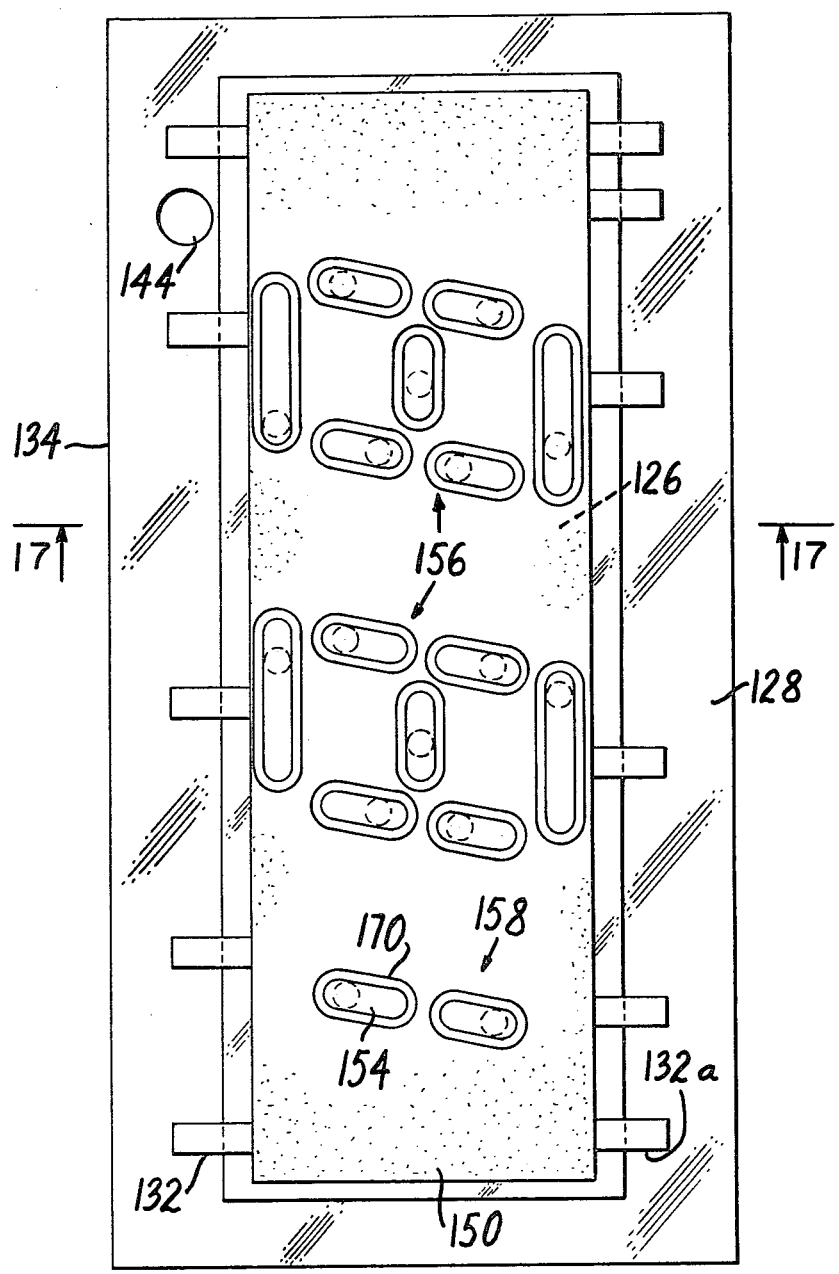

Referring now to FIg. 15, phosphor areas 170 are deposited over the conductive anodes 154 using any convenient method but preferably by silk screening. The phosphor areas may be permitted to cover the entire area of the conductive anodes plus an adjacent region on the insulating layer 150. As disclosed in my copending U.S. patent application Ser. No. 887,885 and incorporated herein by reference, the conductive nature of the typical phosphor used in fluorescent display devices permits such overlap of the insulating layer 150 by the phosphor areas 170. Since the phosphor areas 170 are conductive themselves, the charge applied to the conductive anodes 154 is distributed relatively uniformly out to the perimeters of the phosphor areas 170. In addition, as described in the referenced U.S. patent application, it is possible by appropriate methods described therein to employ continuous stripes of phosphor bridging the gaps between adjacent conductive anodes 154.

The pattern of conductive anodes 154 shown in FIG. 15 is especially suited for use in a digital clock application. Other patterns, of course, may be employed as previously described.

Figure 16:
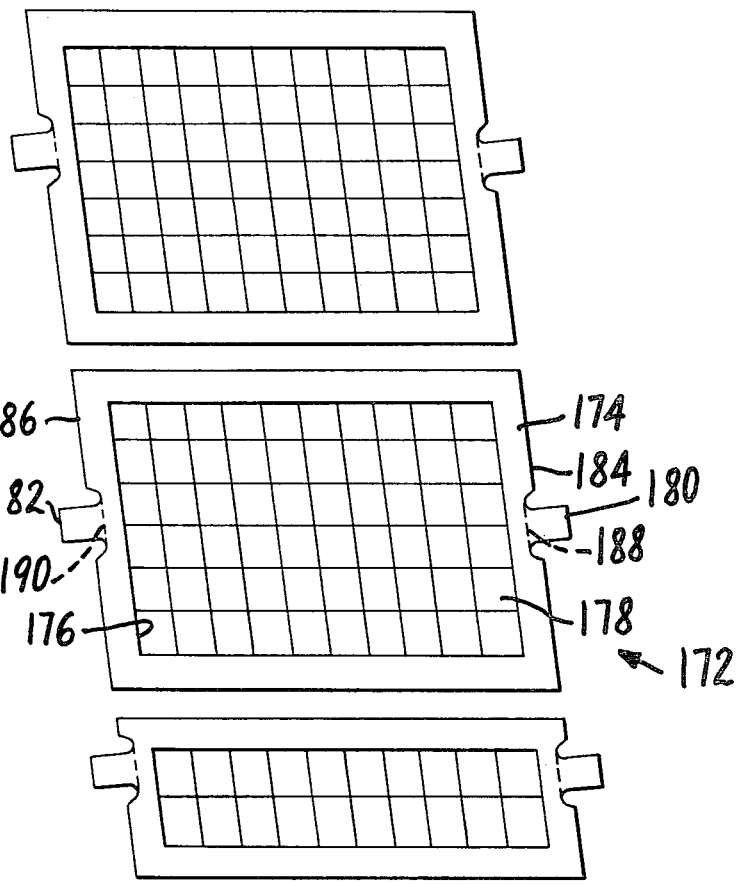
FIG. 16 shows a partial view of grids.

Referring now to FIG. 16, there is shown a set of grids 172 for use with the embodiment of the invention presently being described. The grids 172 have a frame 174 of self-supporting conductive material such as metal formed by any convenient method such as chemical etching or punching. The frame 174 has a large center opening 176. The center opening 176 is covered by a screen 178 which is attached at its perimeter to frame 174. The screen 178 is of conductive material and may be formed of crossed wires but is preferably of metallic foil having a plurality of holes etched or otherwise formed therein and attached to the frame 174 by any convenient means such as conductive adhesive, welding, brazing or soldering.

Attachment tabs 180 and 182, preferably formed integrally with the frame 174 extend from opposed ends 184 and 186 respectively of the frame 174. The attachment tabs 180, 182 are bent along dashed lines 188 and 190 to facilitate insulation of the grids 172 in the device.

Figure 17:
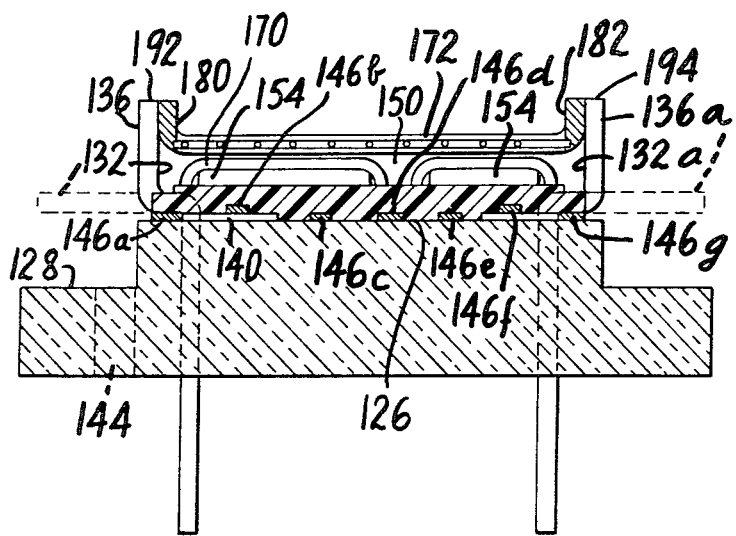
FIG. 17 shows a cross section taken along 17—17 in FIG. 15.

Referring now to FIG. 17, the overhanging pins 132, 132a have been bent upward from their dashed line position to their full line position forming a saddle into which the grid 172 may be fitted and secured. The grid 172 may be secured to the upstanding top ends 192 and 194 of upturned overhanging pins 132, 132a as in the embodiment shown in FIGS. 7 and 8 but is preferably nested within the up-turned overhanging parts 136, 136a with the attachment tabs 180, 182 abutting the up-turned overhanging pins 132, 132a, and attached thereto by an convenient means such as mechanical attachment, soldering, conductive cement or preferably by resistance welding.

The presence of overhanging pins 132, 132a in their original dashed line positions permits machine indexing of the device during the prior operations and also permits access for tools, not shown, to the overhanging end parts 136, 136a to effect the upward bending.

Referring momentarily to FIGS. 12–15, the overhanging pins 132, 132a closest to the opposed ends of the device are preferably employed for supporting a filament holder. These overhanging pins may be bent upward in the same fashion as described for the overhanging pins which support the grids and filament supports may be attached across a pair of pins at each end of the device to support a filament longitudinally disposed over the conductive anodes 154. The filament holders may be of any type known in the art and may be attached by mechanical means, brazing, soldering or preferably by resistance welding. The overhanging pin 132a second from the top right end of the device shown in the figures is provided for internal connection to other elements such as a getter, not shown. The getter may be optionally connected between the first and second bent pins 132a from the top right end of the device and may be electrically activated from external to the device after sealing and evacuation.

With all overhanging pins 132, 132a bent upward as indicated in the preceding, the sealing ledge 128 is cleared for application of a concave cover plate for example the cover plate 196 shown in FIGS. 18 and 19. The cover plate has a transparent top region 198 surrounded by a perimeter 200 extending away from the transparent top region 198 forming a concavity 202. The perimeter 200 terminates in a planar sealing surface 204 which is mated to sealing ledge 128 and is sealed thereto by conventional means such as low temperature melting point glass not shown.

Figure 20:
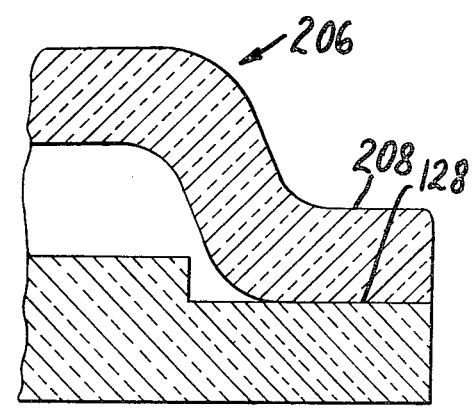
FIG. 20 shows a cross sectional view of the seal region of a second embodiment of a cover plate.

The cover plate 196 shown in FIGS. 18 and 19 is preferably cast glass having substantially straight sides on the perimeter. When sealed at its perimeter to the substrate, the cover plate 196 forms, with the substrate, an enclosure which can be evacuated and sealed. Satisfactory results can be achieved using a formed glass cover plate 206 such as shown in FIG. 20 which has an outward directed sealing flange 208 for sealing against the sealing ledge 128. Use of the formed glass cover plate 206 results in slightly enlarged overall plan view of the device due to the wasted space consumed by outward directed sealing flange 208. Where space is not at a premium, this type of cover plate may be satisfactorily employed.

After sealing of the cover plate in place, the cavity 202 may be evacuated using evacuation opening 144 in a conventional manner optionally followed by gettering.

According to the present invention, it is not necessary that the outward bent pins 132, 132a have overhanging sections 136, 136a. Instead, the invention contemplates an embodiment wherein none of the pins extends in overhanging fashion beyond the plateau surface. In this case, the outward bent pins 132, 132a may be bent upward for attachment of grids, filament holders and getters or, alternatively, may remain flat against the plateau surface 126 and have filament holders and grid supports attached thereto by means well known in the art such as conductive adhesive, soldering, brazing or preferably by resistance welding.

It will be understood that the claims are intended to cover all changes and modifications of the preferred embodiments of the invention, herein chosen for the purpose of illustration which do not constitute departures from the spirit and scope of the invention.

What is claimed is:

1. In a fluorescent display device, apparatus comprising:
   (a) a plurality of metallic leads and supports;
   (b) said plurality of metallic leads and supports being integrally formed with at least one header bar relatively holding and securing said leads and supports at one end thereof;
   (c) a vitreous substrate cast about at least an intermediate portion of said metallic leads and supports, said vitreous substrate holding said metallic leads and supports relative to said substrate so that a substantial portion of said metallic leads and supports remains uncovered between said at least one header bar and one side of said vitreous substrate;
   (d) at least some of said metallic leads and supports extending completely through said vitreous substrate to protrude beyond a second side of said substrate; and
   (e) said at least one header bar being removeable after casting said vitreous substrate whereby relatively positioned plug-in leads are formed.

2. The apparatus recited in claim 1 further comprising at least some of said metallic leads and supports having end portions extending substantially beyond said second side and said end portions being bent over parallel to the surface of said second side.

3. The apparatus recited in claim 2 further comprising a plurality of electrodes formed by silk screening on said vitreous substrate and connected to said end portions.

4. The apparatus recited in claim 3 further comprising a concave cover plate having a sealing surface on the perimeter thereof sealingly affixed to said second side forming an enclosure enclosing said plurality of electrodes.

5. The apparatus recited in claim 4 wherein air in said enclosure is removed and said enclosure is sealed.

6. A method of manufacturing a fluorescent display device comprising the steps of:
   (a) forming a plurality of metallic leads and supports integral with at least one header bar at one end thereof;
   (b) casting a vitreous substrate having first and second sides about a first portion of each of said metallic leads and supports leaving a second portion of said metallic leads and supports uncovered between said header bar and the first side of said vitreous substrate;
   (c) leaving a third portion of at least some of said metallic leads and supports protruding through said second side uncovered by said vitreous substrate;
   (d) connecting electrodes to said third portions;
   (e) sealingly covering said electrodes and third portions with a transparent cover plate to form a sealable enclosure;
   (f) removing the air from said sealable enclosure and sealing said sealable enclosure; and
   (g) removing said header bar whereby said pins are freed for connection.

7. The method of claim 6 further comprising:
(a) bending at least some of said third portions parallel to said second side;
(b) silk screening at least one patterned layer on said second side; then
(c) bending at least some of said third portions upward from parallel to said second side; and
(d) attaching electrodes to the upward bent third portions.

8. The method of claim 7 further comprising:
(a) leaving others of the parallel third portions parallel to said second side; and
(b) contacting said others with said at least one patterned layer.

9. The method of claim 8 wherein the contacting step comprises silk screening a pattern of at least one conductive lead on said second side contacting at least one of said others whereby electrical connection is made between said at least one other third portion and said at least one conductive lead on said second side.

10. The method of claim 9 further comprising:
(a) further silk screening at least one insulating layer over said at least one conductive lead and said at least one other third portion; and
(b) said further silk screening step including leaving at least one via completely therethrough in registration with at most a portion of said at least one conductive lead.

11. The method of claim 10 further comprising still further silk screening a conductive pattern on said insulating layer, said conductive pattern overlaying and penetrating said at least one via and making electrical contact with said at least one conductive lead.

12. The method of claim 11 further comprising:
(a) said at least one other third portion being at least first and second third portions;
(b) said at least one conductive lead being at least a first conductive lead contacting said first other third portion, and a second conductive lead contacting said second other third portion and insulated from said first conductive lead;
(c) said at least one via being at least first and second vias, said first via being in registration with said first conductive lead and said second via being in registration with said second conductive lead; and
(d) said conductive pattern being at least first and second conductive patterns, said first conductive pattern overlapping said first via, said second conductive pattern overlaying said second via, and said first and second conductive patterns being insulated from each other.

13. The method of claim 7 further comprising:
(a) at least one of the parallel third portions extending beyond an edge of said second side; and
(b) bending upward all of said third portions which extend beyond said edge after the step of silk screening whereby none of the third portions extend beyond said edge.

14. The method of claim 6 wherein the step of forming includes:
(a) forming a plateau surface on said second surface; and
(b) forming a stepped sealing ledge depressed below the surface of said plateau surface about the entire perimeter thereof.

15. The method of claim 14 further comprising bending at least some of said third portions parallel to said plateau surface toward the perimeter thereof, the ends of the bent third portions extending past said perimeter and overhanging the depressed stepped sealing ledge.

16. The method of claim 15 further comprising:
(a) silk screening at least one patterned layer on said second side; and then
(b) bending all of said third portions which overhang said depressed stepped sealing ledge upward whereby none of said third portions continue to overhang.

17. The method of claim 6 further comprising:
(a) bending at least one of said third portions parallel to said substrate toward the center line thereof; and
(b) bending at least another of said third portions parallel to said substrate away from the center line thereof.

18. The method of claim 17 wherein at least one of said third portions and at least another of said third portions are at least first and second third portions and said first portion being longer than said second portion.

19. The method of claim 6 further comprising:
(a) forming said plurality of metallic leads and supports integral with first and second header bars; and
(b) connecting said first and second header bars into a unitary assembly.

20. The method of claim 6 further comprising casting said cover plate.

21. A fluorescent display device comprising:
(a) a vitreous substrate having a perimeter, a front face and rear face substantially parallel to said front face, said vitreous substrate being cast about a plurality of pins and supports;
(b) said plurality of pins and supports being integrally formed with at least one header bar relatively holding and securing said leads and supports at one end thereof, said plurality of pins and supports sealingly embedded in said substrate substantially normal to said front and rear faces and extending substantially beyond said front and rear faces;
(c) said at least one header bar being removeable after casting of said vitreous substrate whereby relatively positioned plug-in leads and formed;
(d) a plurality of phosphor coated electrodes disposed on said front face;
(e) means for connecting said plurality of phosphor coated electrodes to selected different ones of said pins;
(f) at least one grid connected to at least one of said supports, said at least one grid being in registration with at least one of said phosphor coated electrodes;
(g) a concave transparent cover plate sealably attached at its perimeter to said substrate and forming therewith a sealed enclosure enclosing said plurality of phosphor coated electrodes; and
(h) means in said sealed enclosure for exciting said phosphor into the emission of light.

22. The fluorescent display device of claim 21 further comprising:
(a) said substrate having a substantially planar plateau surface and a depressed perimeter sealing ledge depressed below said plateau surface; and
(b) said cover plate being sealably attached to said ledge.

23. A fluorescent display device made by the method of any of claims 6, 7, 8, 9, 10, 11, 12, 13, 14, 15, 16, 17, 18, 19 or 20.

* * * * *

UNITED STATES PATENT AND TRADEMARK OFFICE
CERTIFICATE OF CORRECTION

PATENT NO. : 4,259,613
DATED : March 31, 1981
INVENTOR(S) : Richard DuBois

It is certified that error appears in the above-identified patent and that said Letters Patent are hereby corrected as shown below:

Claim 21(c), line 42, change "and" to --are--.

Signed and Sealed this

Thirtieth Day of June 1981

[SEAL]

Attest:

RENE D. TEGTMEYER

Attesting Officer

Acting Commissioner of Patents and Trademarks